United States Patent
Marx et al.

[11] Patent Number: 6,147,321
[45] Date of Patent: Nov. 14, 2000

[54] CONFIGURATION FOR THE AUTOMATIC INSCRIPTION OR REINSCRIPTION OF WAFERS

[75] Inventors: Eckhard Marx, Redeburg; Detlef Gerhard, München; Jens Müller, Dresden, all of Germany

[73] Assignee: Infineon Technologies AG, Munich, Germany

[21] Appl. No.: 09/128,387

[22] Filed: Aug. 3, 1998

[30] Foreign Application Priority Data

Aug. 1, 1997 [DE] Germany ............................ 197 33 412

[51] Int. Cl.⁷ .................................................. B23K 26/00
[52] U.S. Cl. ........................ 219/121.68; 219/121.67; 219/121.69
[58] Field of Search ..................... 219/121.68, 121.67, 219/121.61, 121.69, 121.78, 121.82

[56] References Cited

U.S. PATENT DOCUMENTS

| | | | |
|---|---|---|---|
| 5,175,774 | 12/1992 | Truax et al. | 382/8 |
| 5,265,170 | 11/1993 | Hine et al. | 382/8 |
| 5,329,090 | 7/1994 | Woelki et al. | 219/121.68 |
| 5,511,005 | 4/1996 | Abbe et al. | 364/552 |
| 5,567,927 | 10/1996 | Kahn et al. | 235/462 |
| 5,877,064 | 3/1999 | Chang et al. | 438/401 |
| 5,877,899 | 3/1999 | Stern et al. | 359/633 |
| 5,942,763 | 8/1999 | Mukogawa | 250/559.44 |

*Primary Examiner*—Patrick Ryan
*Assistant Examiner*—M. Alexandra Elve
*Attorney, Agent, or Firm*—Herbert L. Lerner; Laurence A. Greenberg; Werner H. Stemer

[57] ABSTRACT

A configuration for the automatic inscription or reinscription of wafers provides the wafers with a marking for identification and for process management during the production of semiconductor components. The wafer must be moved between different stations for the automatic inscription of a wafer in an appropriate device. Considerable transport movements are saved by the integration of a read station in an inscription chamber having a positioning unit for the wafer.

3 Claims, 1 Drawing Sheet

PRIOR ART
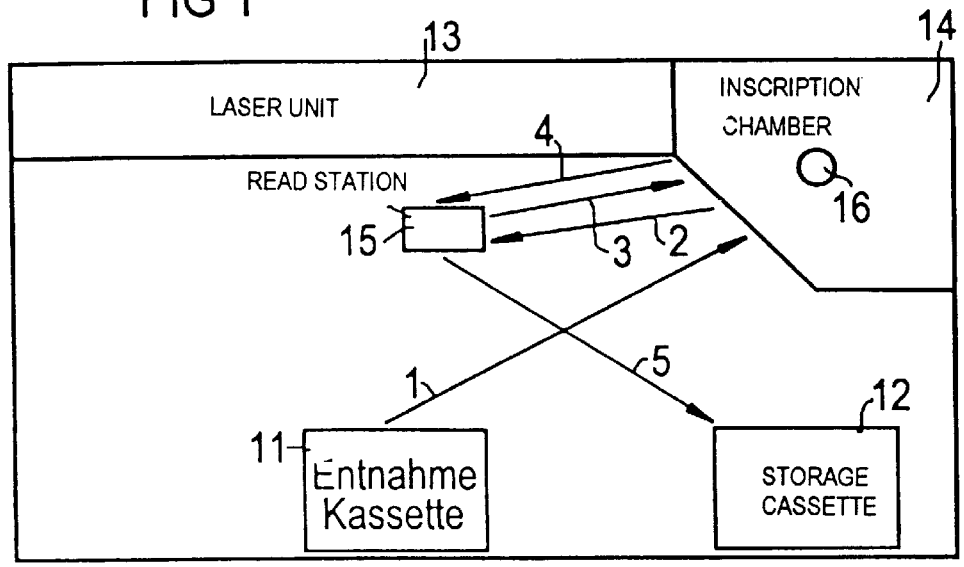
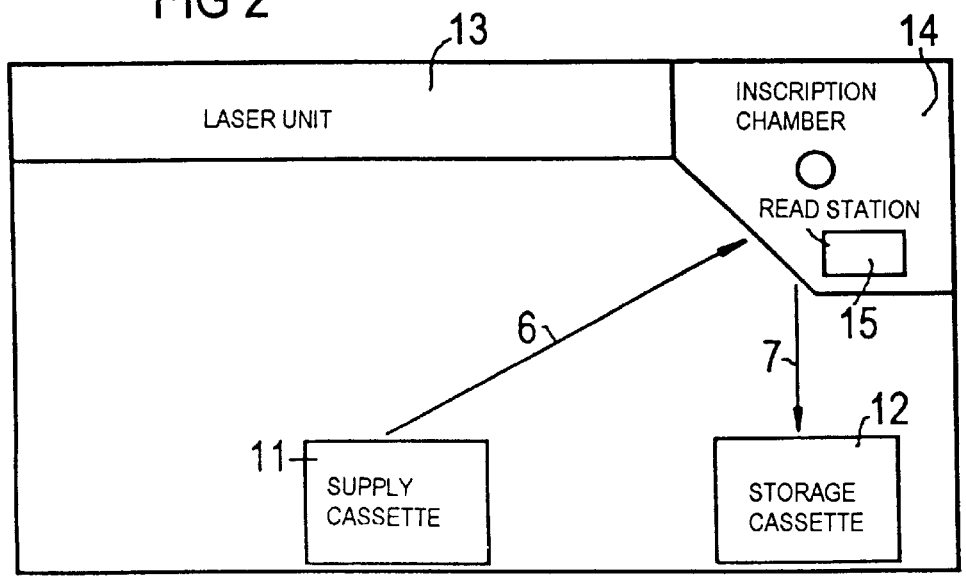

CONFIGURATION FOR THE AUTOMATIC INSCRIPTION OR REINSCRIPTION OF WAFERS

BACKGROUND OF THE INVENTION

Field of the Invention

The invention relates to a configuration for the inscription of wafers. The inscription includes a coding and is applied by using a laser.

Semiconductor wafers are provided with a wafer identification on the front before manufacture. The wafer identification or marking is fused in by laser and is used to distinguish between the wafers and to distinguish between entire manufacturing batches. Furthermore, information is included about the assignment of manufacturing and product data. Thus, with its marking, each wafer bears the essential information for its identification and for defining the processing on the wafer. That results in the requirement that the wafer marking must be legible until the final manufacturing step.

As a result of the increasing number of processes and the use of so-called CMP (chemical mechanical polishing) processes on the front of the wafer, the marking which is applied to the front is increasingly worn out by the application and removal of coatings. In the end, that leads to the applied marking being erased completely. That problem occurs only with the increased use of CMP processes. Permanent identification of the wafers within process lines can be maintained by using reinscription methods at a suitable point.

The reinscription must be carried out automatically in order to prevent any incorrect, multiple or double wafer marking being applied during the reinscription process.

The use of so-called hardmarks is linked to spattering during the introduction of the marking. That is based on the fact that high-energy laser radiation does not just melt the wafer material but, to some extent, vaporizes it. That leads to yield losses. However, the use of so-called softmarks as an alternative to the deeper hardmarks leads to a marking which is applied on a wafer becoming illegible during the processing involved with the production of semiconductor components.

Previous configurations for wafer inscription include an inscription chamber which is coupled to a laser unit. The only item provided within the inscription chamber is a positioning unit for holding and for exact alignment of a wafer. An inscription check, which is carried out after the inscription process using a read system, takes place outside the inscription chamber, and outside the region in which the positioning unit acts. At least in the case of reinscription processes, that leads to a severe reduction in throughput and, depending on the sequence of the inscription process, to poorer positioning of the reinscription.

SUMMARY OF THE INVENTION

It is accordingly an object of the invention to provide a configuration for the automatic inscription or reinscription of wafers, which overcomes the hereinafore-mentioned disadvantages of the heretofore-known devices of this general type and which carries out an inscription check with a read device, in addition to the inscription process, with the wafer throughput being increased.

With the foregoing and other objects in view there is provided, in accordance with the invention, a configuration for the automatic inscription or reinscription of wafers, comprising a supply cassette; an inscription chamber having a positioning unit for predetermined alignment of a wafer and for maintaining the wafer on the positioning unit for an entire marking process; a storage cassette; a handling device for handling wafers between the individual components; a laser unit for placing a marking on a wafer; and a read station disposed within the inscription chamber in such a way that the marking is legible and a renewed marking can be applied on the wafer with the laser unit at a predetermined position.

In accordance with a concomitant feature of the invention, the read station can subsequently read a marking applied during an inscription process for quality control.

Other features which are considered as characteristic for the invention are set forth in the appended claims.

Although the invention is illustrated and described herein as embodied in a configuration for the automatic inscription or reinscription of wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a configuration for the automatic inscription and reinscription of wafers according to the prior art; and FIG. 2 is a block diagram of a configuration for the automatic inscription and reinscription of wafers according to the invention.

DESCRIPTION OF THE PREFERRED EMBODIMENTS

Referring now to the figures of the drawings in detail and first, particularly, to FIG. 1 thereof, there is seen a prior art configuration for wafer inscription including an inscription chamber 14 which is coupled to a laser unit 13. The only item provided within the inscription chamber 14 is a positioning unit 16 for holding and for exact alignment of a wafer. An inscription check, which is carried out after the inscription process by using a read station 15 or read system, takes place outside the inscription chamber 14, and outside a region in which the positioning unit 16 acts. The prior art configuration also includes a supply cassette 11 and a storage cassette 12 for wafers. Other details are given below. At least in the case of reinscription processes, such a structure leads to a severe reduction in throughput and to poorer positioning of the reinscription, depending on the sequence of the inscription process.

FIG. 2 shows a read station 15 or a read system which is fitted in an inscription chamber 14 or above a positioning unit 16 (aligner), for an automatic inscription process according to the invention. A marking which has been applied on a wafer is thus legible when the wafer is located in the inscription chamber 14 on the positioning unit 16.

A station for alignment of a wafer orientation in three spatial coordinates as well as with respect to rotation angle is referred to as a positioning unit/aligner 16. That station is normally accommodated in the inscription chamber 14. The inscription chamber 14 is a processing station in which the wafer is directly inscribed or marked by a laser unit 13.

Accurate alignment of the wafer is necessary for an inscription and, in particular, for a reinscription. Thus, major advantages result from the fact that a holder on the positioning unit 16, for example a rotating plate with a vacuum holder (so-called chuck), need be moved backward and forward only between the read station 15 and the correct positioning for laser inscription by the laser unit 13. There is no need for the wafer to be removed from the positioning unit 16, to be transported to an external read station 15 and to be transported back to the inscription chamber 16.

The wafers are provided with an edge cutout (they are notched) as an aid for the positioning of a wafer. The read system is installed in such a manner that the inscription location of the wafers which are notched and reinscribed in the final position is located directly underneath the read system. Consequently, an optimum throughput is actually achieved for the reinscription process, since a correctly aligned wafer is necessary for the inscription process.

During the reinscription process, the wafer identification is read by the read station 15 within the inscription chamber 14, before the inscription process. This information is passed on to a central data unit, and the wafer is then reinscribed at a predetermined point.

After the inscription process, the inscription which has been applied on the wafer is applied again underneath the read station, which is positioned in the inscription chamber 14, and the marking is checked for legibility and for content. In this case, a read head of a read station 15 is located closely above the wafer surface.

In the figures, a handling device for handling wafers between the supply cassette 11, the inscription chamber 14 and the storage cassette 12 is indicated by arrows.

Referring to FIG. 1, in which the prior art is illustrated, the following method movements of a wafer are required for the inscription process:
Transport movement 1
  Move a wafer from a supply cassette 11 to the inscription chamber 14 having the positioning unit 16;
  Align the wafer so that the inscription position can be positioned correctly underneath the read station 15;
Transport movement 2
  Move the wafer underneath the read station 15;
  Read the inscription content for the reinscription process;
Transport movement 3
  Move the wafer into the inscription chamber 14;
  Position the wafer underneath the laser unit 13;
  Inscribe the wafer;
  Align the wafer in the position for the read station 15;
Transport movement 4
  Move the wafer underneath the read station 15;
  Check the inscription quality;
Transport movement 5
  Transport the wafer to a storage cassette 12.
  Referring to FIG. 2, a reinscription device constructed according to the invention, that is a configuration with the units described, only has transport movements 6 and 7.

Transport movement 6
  Transport the wafer from the supply cassette 11 to the inscription chamber 14 on the positioning unit 16;
  Align the wafer so that the inscription position is positioned correctly underneath the read system;
  Inscription/marking/read;
  Position the wafer underneath the read unit;
  Inscribe the wafer;
  Position the wafer underneath the read system;
  Check the inscription quality;
Transport movement 7
  Transport the wafer to the storage cassette 12.

The last-mentioned configuration according to FIG. 2 thus offers the capability of economic, automatic wafer inscription with an inscription check. A handling device which controls the transport movements is required only to transport the wafer from the supply cassette 11 to the inscription chamber 14, and from the inscription chamber 14 to the storage cassette 12. The throughput of the inscription system can thus be considerably increased.

It is possible to carry out both reinscription and initial inscription of wafers by using a configuration according to the invention. During the initial inscription of wafers, the information relating to the configuration of the marking to be applied on the wafer must be made available from a central control unit. The read station 15 can read, and appropriately check, the applied marking just as well as the reinscription.

We claim:

1. A configuration for the automatic inscription of wafers, comprising:

a supply cassette for supplying wafers;

an inscription chamber having a positioning unit for predetermined alignment of a wafer received from said supply cassette and for maintaining the wafer on said positioning unit for an entire marking process;

a storage cassette for storing wafers;

a handling device for handling wafers between said supply cassette, said inscription chamber and said storage cassette;

a laser unit for placing a marking on a wafer; and a read station disposed within said inscription chamber in such a manner that the marking is legible and a new marking can be applied on the wafer with said laser unit at a predetermined position.

2. The configuration according to claim 1, wherein said read station can subsequently read a marking applied during an inscription process for quality control.

3. The configuration according to claim 1, wherein said read station applies a new marking which is a renewal of an already existing marking.

* * * * *